3/23/82 OR 4,321,594

United States Patent [19]

Galvin et al.

[11] 4,321,594

[45] Mar. 23, 1982

[54] PASSIVE INFRARED DETECTOR

[75] Inventors: Aaron A. Galvin, Lexington; John K. Guscott, Lynnfield, both of Mass.

[73] Assignee: American District Telegraph Company, New York, N.Y.

[21] Appl. No.: 90,399

[22] Filed: Nov. 1, 1979

[51] Int. Cl.$^3$ .......................... G08B 13/18; H01L 9/00

[52] U.S. Cl. .......................... 340/567; 250/342; 250/353; 340/555; 350/452

[58] Field of Search .......................... 340/555, 565, 567; 350/211, 452; 250/342, 349, 353, 510, 514

[56] References Cited

U.S. PATENT DOCUMENTS

| | | | |
|---|---|---|---|
| 3,203,306 | 8/1965 | Lefferts | 350/211 |
| 3,631,434 | 12/1971 | Schwartz | 340/567 |
| 3,760,399 | 9/1973 | Schwartz | 340/567 |
| 3,839,640 | 10/1974 | Rossin | 250/342 X |
| 4,024,397 | 5/1977 | Weiner | 250/353 |
| 4,052,616 | 10/1977 | Keller | 250/353 |
| 4,087,688 | 5/1978 | Keller | 250/342 |
| 4,115,701 | 9/1978 | Guichard | 250/353 X |

FOREIGN PATENT DOCUMENTS

| | | | |
|---|---|---|---|
| 1157951 | 7/1969 | United Kingdom | 250/349 |

*Primary Examiner*—John W. Caldwell, Sr.
*Assistant Examiner*—Joseph E. Nowicki
*Attorney, Agent, or Firm*—Weingarten, Schurgin & Gagnebin

[57] ABSTRACT

A passive infrared intrusion detection system is provided in which one or more Fresnel lenses are employed to focus received infrared energy onto a detector element which provides an electrical output signal indicative of the level of received radiation. The Fresnel lens is preferably formed of a plastic material which is translucent to visible light such that visible light is not focussed onto the detecting element while infrared radiation is.

8 Claims, 7 Drawing Figures

PASSIVE INFRARED DETECTOR

FIELD OF THE INVENTION

This invention relates to infrared intrusion detection systems and more particularly to a passive infrared system for sensing the infrared radiation provided by an intruder entering a protected area.

BACKGROUND OF THE INVENTION

In a passive infrared intrusion detection system, infrared radiation in an area under surveillance is focussed by an optical element or optical assembly onto one or more detecting elements which provide output signals representative of the level of received radiation. A germanium lens may be employed to focus incident infrared energy onto the detector, or one or more mirrors can be employed to focus incident energy onto a detector or group of detectors. Optical assemblies are also known which comprise an array of reflecting elements to focus onto one or more detectors energy from a plurality of directions, such assemblies being employed in so-called multiple beam passive infrared systems, the term beam referring to the zone of sensitivity. Examples of known systems are shown in U.S. Pat. Nos. 3,036,219; 3,524,180; 3,631,434; 3,703,718 and 3,886,360.

The optical assembly constitutes a significant portion of the cost of a detection system and for systems where cost is a major factor, as in residential and some commercial installations, it would be advantageous to have a passive infrared detection system of relatively low manufacturing cost and simplicity.

SUMMARY OF THE INVENTION

Briefly, the present invention provides a passive infrared intrusion detection system in which one or more Fresnel lenses function to focus incident infrared energy onto one or more associated detecting elements. The Fresnel lens is preferably formed in a molded plastic sheet of a material such as polyethylene which is transparent to infrared energy within the spectrum of interest, typically 8-14 microns and translucent to visible light for diffusing the visible light. One or more Fresnel lenses can be provided on a single sheet which can be manufactured at relatively low cost in comparison to germanium lenses or mirrors employed in known infrared detection systems. The Fresnel lens diffuses visible light thereby to provide discrimination between visible light which is not focussed onto a detector, and infrared radiation which is focussed onto the detector to indicate intruder presence.

DESCRIPTION OF THE DRAWINGS

The invention will be more fully understood from the following detailed description taken in conjunction with the accompanying drawings in which.

DETAILED DESCRIPTION OF THE INVENTION

Figure 1:
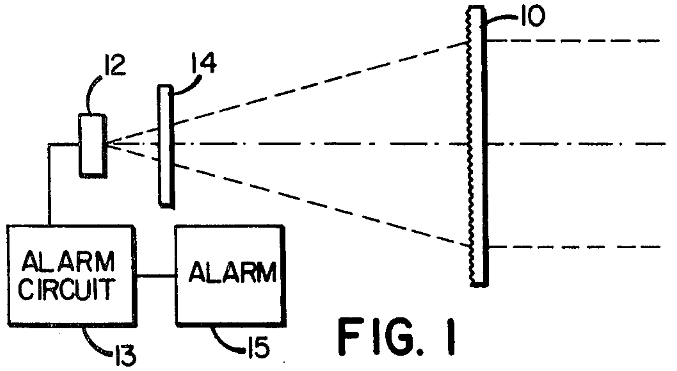
FIG. 1 is a diagrammatic representation of the invention employing a single Fresnel lens.

Referring to FIG. 1 there is shown a Fresnel lens 10 disposed to receive incident infrared radiation from an area under surveillance and to focus received radiation onto a detector 12 which is of any well known type providing an electrical output signal representative of the level of received radiation. The detector signal is coupled to an alarm circuit 13 which is operative to trigger an alarm 15. The alarm circuit can employ known signal processing techniques to discriminate actual alarm signals from noise and spurious signals, to minimize false alarms. An optical filter 14 may be employed to reject natural and artificial light outside of the infrared spectrum of interest. The lens material can itself be of a material which is not transparent to visible light or which transmits diffuse non-focussed visible light, thus providing filtering action between a spectrum of interest and unwanted spectrum. The Fresnel lens is preferably formed in a sheet of plastic material which is transparent to the infrared energy of interest. The material can typically be polyethylene which is transparent to infrared energy in the range of interest, typically 8-14 microns and translucent to visible light so that diffused light is transmitted through the sheet and not focussed on the detector. The lens pattern can be formed in the plastic material by molding, or by cutting or scribing of the concentric pattern into a surface of the sheet.

Figure 7:
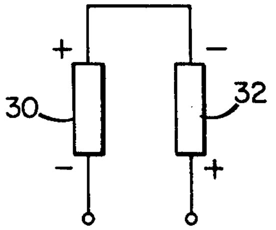
FIG. 7 is a schematic representation of a balanced detector useful in the invention.

To differentiate between focussed radiation in the infrared spectrum of interest and diffuse non-focussed visible light, the detector 12 should be a balanced detector composed of two sensing elements 30 and 32 electrically connected in series opposition, as shown in FIG. 7. The focussed infrared radiation from a moving target as it moves across a field of view will impinge on the detector elements 30 and 32 unequally to produce a net positive or negative signal from the detector. Diffuse visible radiation, which is not focussed by the Fresnel lens, will illuminate the two detector elements equally, causing no output signal from the detector. A single ended, non-balanced, detector can also provide differentiation of the diffuse non-focussed visible light, but such discrimination depends upon the relative intensities of the focussed and non-focussed radiation. If the intensity of the diffuse radiation is sufficiently high, such as from a bright source, the single ended detector may provide an unwanted output signal. Thus, the balanced detector is preferred to enhance the selective detection of focussed infrared radiation.

Figure 2:
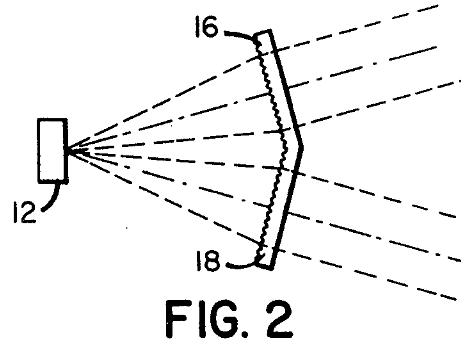
FIGS. 2 and 3 are diagrammatic representations of alternative embodiments of the invention employing, respectively, two and three Fresnel lenses for multiple beam operation.
Figure 3:
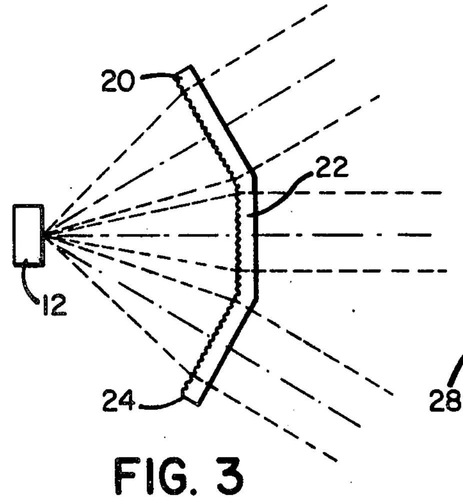
Figure 4:
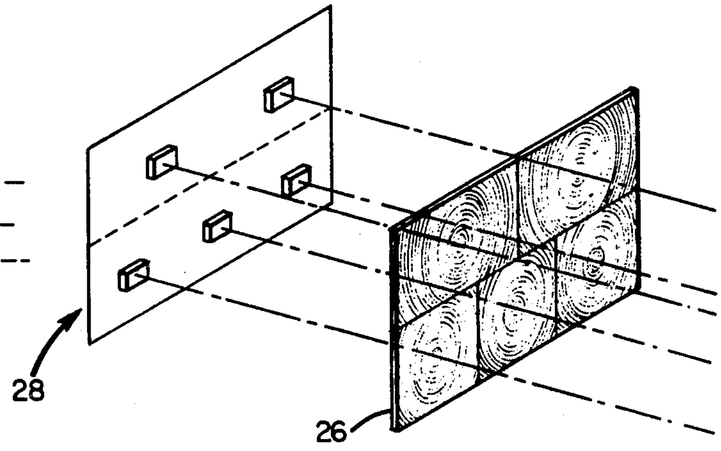
FIG. 4 is a diagrammatic pictorial representation of a further embodiment of the invention employing a plurality of Fresnel lenses in a single sheet.

For multiple beam operation, a plurality of Fresnel lenses can be provided as illustrated in FIGS. 2, 3 and 4. In the embodiment of FIG. 2, two Fresnel lenses 16 and 18 are angularly disposed to receive and focus respective beams of incident energy, while in the version of FIG. 3, three lenses 20, 22 and 24 are employed to focus, respectively, three incident beams of infrared energy. The multiple Fresnel lenses can be formed in a single sheet which is bent or otherwise angularly formed to the intended disposition, or individual sheets can be employed and placed in intended angular relationship. In the embodiment of FIG. 4, five Fresnel lenses are illustrated as being formed in a single planar sheet 26, each being operative to focus energy onto a respective detector of a detector array 28. It will be appreciated that any number of Fresnel lenses can be provided to suit the number of beams to be received. The lenses can be fabricated at relatively low cost in relation to conventional infrared lenses and mirrors and provide an optical assembly of extremely simple construction.

Figure 5:
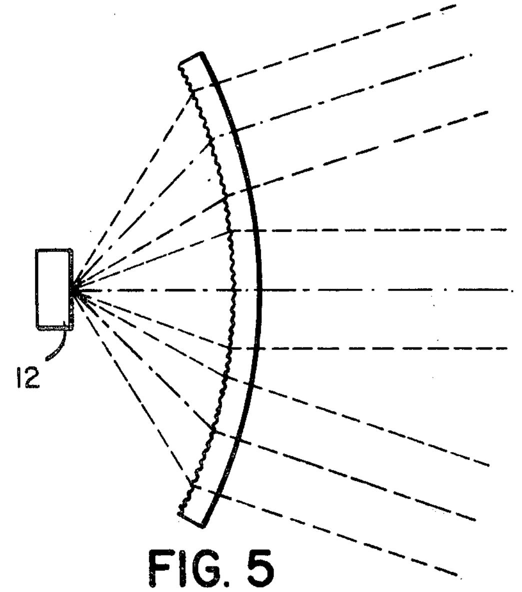
FIG. 5 is a diagrammatic representation of an alternative embodiment of the invention employing a cylindrical sheet.

A further embodiment is shown in FIG. 5 wherein a sheet 30 is configured in a cylindrical or other curved arc and having three Fresnel lenses formed in the sheet, each centered about a respective axis. The lenses are sufficiently small in relation to the cylindrical curvature such that the focussing error of the curved lenses is small. Each of the lenses in sheet 20 focusses its received infrared radiation onto detector 12.

Figure 6:
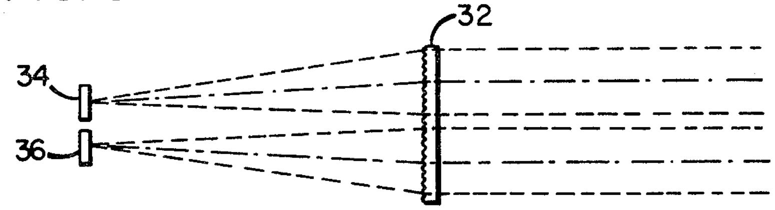
FIG. 6 is a diagrammatic representation of a further embodiment of the invention employing multiple detectors.

The invention can also be employed with separate detectors for each beam of radiation. For example, in the embodiment of FIG. 6, a pair of Fresnel lenses in sheet 32 focusses radiation onto respective detectors 34 and 36. The electrical output signals from the detectors are processed in known manner by an alarm circuit to actuate an alarm when intruder presence is sensed. Usually the detector output signals must exceed a predetermined threshold level before an alarm is triggered, and the presence of output signals from both detectors within a specified time interval can be required before an alarm is triggered.

The invention is not to be limited except as indicated in the appended claims.

What is claimed is:

1. A passive infrared intrusion detection system comprising:

a sheet of material transmissive to infrared radiation in a predetermined infrared range and having at least one Fresnel lens formed therein, said lens being disposed to receive and to focus incident infrared radiation from a protected area, said sheet being translucent to light outside of said infrared range such that visible light is diffused by said sheet; and a blanced detector disposed at the focus of said lens, said detector having two sensing elements electrically connected in series opposition and operative to provide an electrical output signal in response to the infrared radiation focused thereon, and substantially no output signal in response to diffused non-focused visible light transmitted by said sheet.

2. The system of claim 1 further including an optical filter interposed between said Fresnel lens and said detector and operative to reject light outside of the infrared spectrum of interest.

3. The system of claim 1 wherein said sheet includes a plurality of Fresnel lenses each operative to focus incident infrared energy onto an associated detector.

4. The system of claim 1 wherein said sheet is disposed in a curved arc and includes a plurality of Fresnel lenses formed therein, each centered about a respective axis for receipt of incident infrared radiation therealong, the lenses being small in relation to the curvature of the sheet such that focussing error due to curvature of the lenses is small.

5. The system of claim 1 wherein said sheet is polyethylene.

6. The system of claim 1 wherein said infrared range is about 8–14 microns.

7. The system of claim 1 wherein the sensing elements of said balanced detector receive the focused infrared radiation unequally from a moving target in the protected area and provide said electrical output signal in response thereto, and receive diffused non-focused visible light substantially equally to produce no output signal.

8. The system of claim 7 further including an alarm circuit operative in response to said output signal derived from the focused infrared radiation to provide an alarm indication.

* * * * *